United States Patent
Shim et al.

(10) Patent No.: US 7,499,258 B2
(45) Date of Patent: Mar. 3, 2009

(54) EMBEDDED MULTILAYER CHIP CAPACITOR AND PRINTED CIRCUIT BOARD HAVING THE SAME

(75) Inventors: Chang Hoon Shim, Kyungki-do (KR); Jin Yong An, Daejeon (KR); Suk Hyeon Cho, Daejeon (KR); Sung Hyung Kang, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 263 days.

(21) Appl. No.: 11/319,722

(22) Filed: Dec. 29, 2005

(65) Prior Publication Data
US 2006/0198079 A1    Sep. 7, 2006

(30) Foreign Application Priority Data
Mar. 7, 2005    (KR)    ...................... 10-2005-0018702

(51) Int. Cl.
*H01G 4/236*    (2006.01)
*H01G 4/06*    (2006.01)

(52) U.S. Cl. .................. 361/307; 361/311; 361/763

(58) Field of Classification Search ................. 361/311, 361/303, 306.3, 307, 309, 306.1, 763
See application file for complete search history.

(56) References Cited

U.S. PATENT DOCUMENTS

| | | | |
|---|---|---|---|
| 6,370,010 B1 | 4/2002 | Kuroda et al. | |
| 6,407,907 B1 * | 6/2002 | Ahiko et al. | 361/306.3 |
| 6,459,561 B1 * | 10/2002 | Galvagni et al. | 361/306.3 |
| 6,470,545 B1 * | 10/2002 | Branchevsky | 29/25.42 |
| 6,606,237 B1 | 8/2003 | Naito et al. | |
| 6,982,862 B2 * | 1/2006 | Kobayashii | 361/306.1 |
| 2004/0027813 A1 * | 2/2004 | Li | 361/767 |
| 2006/0139849 A1 * | 6/2006 | Yoon et al. | 361/306.3 |
| 2006/0163768 A1 * | 7/2006 | Needes et al. | 264/104 |

FOREIGN PATENT DOCUMENTS

JP    2002-100875 A    4/2002

(Continued)

OTHER PUBLICATIONS

Japanese Office Action, w/ English translation thereof, issued in Japanese Patent Application No. JP 2005-375772 dated on Sep. 2, 2008.

(Continued)

*Primary Examiner*—Eric Thomas
(74) *Attorney, Agent, or Firm*—McDermott Will & Emery LLP

(57) ABSTRACT

The invention provides an embedded multilayer chip capacitor, and a printed circuit board having the same. The embedded multilayer chip capacitor has a capacitor body having a plurality of dielectric layers stacked one on another; a plurality of first and second internal electrodes formed inside the capacitor body, separated by the dielectric layers; and first and second vias extended vertically inside the capacitor body. The first via is connected to the first internal electrodes and the second via is connected to the second internal electrodes. The first via is led to a bottom of the capacitor body and the second via is led to a top of the capacitor body.

17 Claims, 9 Drawing Sheets

FOREIGN PATENT DOCUMENTS

| | | |
|---|---|---|
| JP | 2003-142830 A | 5/2003 |
| JP | 2003-204163 A | 7/2003 |
| JP | 2004-31926 A | 1/2004 |
| KR | 10-2001-0039561 A | 5/2001 |

OTHER PUBLICATIONS

English Translation of Korean Office Action issued in Korean Patent Application No. KR 10 2005-0018702 dated on Jun. 19, 2006.

* cited by examiner (a)

(b)

(a)

(b)

EMBEDDED MULTILAYER CHIP CAPACITOR AND PRINTED CIRCUIT BOARD HAVING THE SAME

RELATED APPLICATION

This application claims the benefit of Korean Patent Application No. 2005-0018702 filed on Mar. 7, 2005, in the Korean Intellectual Property Office, the disclosure of which is incorporated herein by reference.

BACKGROUND OF THE INVENTION

1. Field of the Invention

The present invention relates to a multilayer chip capacitor. More particularly, the present invention relates to a highly-reliable embedded multilayer chip capacitor, and a printed circuit board having the same.

2. Description of the Related Art

With higher density and integration of electronic circuits, printed circuit boards lack a space for mounting a passive device. To overcome this, efforts have been under way to implement embedded devices or parts embedded in the board. Especially, various suggestions have been made regarding a method for embedding a capacitor, used as capacitive parts, in the board. In a method to embed the capacitor in the board, the board itself is utilized as dielectric material for the capacitor, and copper wiring is used as an electrode therefore. In another method, polymer sheets with high dielectric constant or thin dielectric films are formed inside a board to provide an embedded capacitor. Other methods include embedding a multilayer chip capacitor in a board.

Generally, a multilayer chip capacitor includes a plurality of dielectric layers made of ceramic material, and internal electrodes interleaved between the dielectric layers. The multilayer chip capacitor arranged inside the board can have high capacitance. For example, Japanese Laid Open Patent Application No. 2002-100875 discloses a technology for embedding a two-terminal multilayer chip capacitor in a core substrate. The embedded multilayer chip capacitor disclosed in the aforesaid document includes 2 external electrodes formed on both sides of the capacitor. According to the conventional technology, typically a thin-film multilayer chip capacitor is used to embed the capacitor in the board.

FIGS. 1(a) and 1(b) show a conventional two-terminal multilayer chip capacitor used as an embedded capacitor. Referring to FIGS. 1(a) and 1(b), the embedded chip capacitor 10 includes 2 external electrodes 11, 13 formed on both sides of the capacitor and a capacitor body 15 made of dielectrics. As shown in FIG. 1(b), first internal electrodes 23 and second internal electrodes 23 are arranged on opposed faces inside the capacitor body 15. First internal electrodes 21 are connected to first external electrode 11 and second internal electrodes 23 are connected to second external electrode 13, thus exhibiting opposite polarity.

To be embedded in the board, the multilayer chip capacitor 10 should be made thin. The thin multilayer chip capacitor 10 may tend to suffer from chipping 5 or cracking 6 in handling during or after fabrication thereof. The chipping or cracking undermines reliability of the capacitor and possibly causes malfunction thereof.

FIG. 2(a) is a sectional view illustrating a conventional printed circuit board 20 embedded with the multilayer chip capacitor 10. Referring to FIG. 2(a), the printed circuit board 20 includes a top multilayer plate 30, a bottom multilayer plate 35, and a core substrate 40 interleaved there between. The multilayer chip capacitor 10 is arranged in a groove formed in the core substrate. External electrodes 11, 13 of the capacitor are coupled to pads 61, 63 through conductive vias 51, 53, respectively.

To manufacture the printed circuit board 20, the capacitor 10 is inserted inside the core substrate 40. Then via holes should be perforated in the top multilayer plate 30 and the bottom multilayer plate 35 by laser to couple substrate wiring to the external electrodes 11, 13 of the capacitor. This laser process increases manufacturing costs of the printed circuit board significantly. Also, smaller size in the multilayer chip capacitor 10 reduces precision of the laser process, rendering it difficult to align via holes adequately. Further, if the board 20 is warped in the process of manufacturing the printed circuit board 20 embedded with the conventional capacitor 10 or handling the printed circuit board 20 manufactured, the capacitor inside the board may sustain mechanical damage. That is, as shown in FIG. 2(b), in case where the board 20 is warped, the thin-film capacitor 10 may undergo cracks 70 easily, thus possibly breaking off the capacitor 10.

SUMMARY OF THE INVENTION

The present invention has been made to solve the foregoing problems of the prior art and it is therefore an object of the present invention to provide a highly reliable embedded multilayer chip capacitor suffering from less chipping or cracking.

It is another object of the invention to provide a highly-reliable printed circuit board having an embedded multilayer chip capacitor capable of saving manufacturing costs and preventing mechanical damage of the capacitor.

According to an aspect of the invention for realizing the object, there is provided an embedded multilayer chip capacitor comprising: a capacitor body having a plurality of dielectric layers stacked one on another; a plurality of first and second internal electrodes formed inside the capacitor body, separated by the dielectric layers; and first and second vias extended vertically inside the capacitor body, the first via connected to the first internal electrodes and the second via connected to the second internal electrodes, wherein the first via is led to a bottom of the capacitor body and the second via is led to a top of the capacitor body.

According to the invention, the portion of the first via led to the bottom is connected to a lower conductive layer of a printed circuit board where the multilayer chip capacitor is embedded, and the portion of the second via led to the top is connected to an upper conductive layer of the printed circuit board.

According to an embodiment of the invention, the first and second electrodes each have a through hole, and the first via passes the through holes of the second internal electrodes without touching inner circumferences of the through holes of the second internal electrodes, and the second via passes the through holes of the first electrodes without touching inner circumferences of the through holes of the first internal electrodes. Also the fist via is in contact with an electrode surface of the first internal electrodes while the second via is in contact with an electrode surface of the second internal electrodes. This structure of a through hole enables the first internal electrodes to be connected only to the first via and the second internal electrodes to be connected only to the second internal electrodes. But the present invention is not limited to the aforesaid through holes, and the internal electrodes may have other structures.

According to one embodiment of the invention, the embedded multilayer chip capacitor may further comprise an upper external electrode formed on a top of the capacitor body; and a lower external electrode formed on a bottom of the capacitor body, wherein the lower external electrode is connected to the first internal electrodes through the first via, and the upper external electrode is connected to the second internal electrodes through the second via.

According to another embodiment of the invention, the embedded multilayer chip capacitor may further comprise a first bump formed on the portion of the first via led to the bottom, and a second bump formed on the portion of the second via led to the top. The bumps can serve as a kind of capacitor terminal. Therefore, in this case, the bumps enable the internal electrodes to be coupled to a wiring structure of the printed circuit board without separate external electrodes.

According to further another embodiment of the invention, the multilayer chip capacitor may not have external electrodes or bumps formed on the portion of the first and second vias led to the bottom and top. In this case, the portion of the first via led to the bottom is directly connected to the lower conductive layer and the portion of the second via led to the top is directly connected to the upper conductive layer.

According to the preferred embodiment, the embedded multilayer chip capacitor has a width of 0.4 to 2.0 mm, a length of 0.4 to 2.0 mm, and a thickness of 0.05 to 1.0 mm. A ratio of thickness with respect to width and length should be big enough to ensure superior mechanical properties of the capacitor.

According to one embodiment of the invention, the first and second vias may have a circular cross section. In this case, the section of the first and second vias is 50 to 500 µm in diameter.

In addition, in other embodiment of the invention, the first and second vias have a rectangular cross section. In this case, the section of the first and second vias is 50 to 500 µm in width and length, respectively. The first and second vias may have a triangle, hexagonal or other-shaped cross section.

According to another aspect of the invention for realizing the object, there is provided a printed circuit board comprising: a core substrate; a plurality of multilayer chip capacitors arranged horizontally inside the core substrate; and upper and lower conductive layers connecting the multilayer chip capacitors in parallel, the upper conductive layer formed on a top of the multilayer chip capacitors, and the lower conductive layer formed on a bottom of the multilayer chip capacitors.

The upper and lower conductive layers may comprise one selected from a group consisting of a conductive adhesion polymer layer, a conductive tape, a conductive epoxy resin layer, a conductive paste layer and a plated layer.

According to the invention, each of the multilayer chip capacitors may comprise: a capacitor body having a plurality of dielectric layers stacked one on another; a plurality of first and second internal electrodes formed inside the capacitor body, separated by the dielectric layers; and first and second vias extended vertically inside the capacitor body, the first via connected to the first internal electrodes and the second via connected to the second internal electrodes, wherein the first via is led to a bottom of the capacitor body and the second via is led to a top of the capacitor body.

According to one embodiment of the invention, each of the multilayer chip capacitors may further comprise an upper external electrode formed on a top of the capacitor body; and a lower external electrode formed on a bottom of the capacitor body, wherein the upper external electrode is directly connected to the upper conductive layer and the lower external electrode is directly connected to the lower conductive layer.

According to another embodiment of the invention, each of the multilayer chip capacitors may further comprise a first bump formed on the portion of the first via led to the bottom and a second bump formed on the portion of the second via led to the top, and wherein the first bump is directly connected to the lower conductive layer and the second bump is directly connected to the upper conductive layer.

According to still another embodiment, each of the multilayer chip capacitor may not have the external electrodes or the bumps of the portions of the first and second vias led to the bottom and top. In this case, the portion of the first via led to the bottom is directly connected to the lower conductive layer, and the portion of the second via led to the top is directly connected to the upper conductive layer.

According to the invention, although the printed circuit board is bent, the capacitor embedded in the board does not sustain damage. To this end, a plurality of embedded chip capacitors having a horizontal length smaller than a typical thin film embedded chip capacitor (refer to FIG. 1(a)) are arranged horizontally inside the printed circuit board and then connected in parallel. This prevents mechanical damage of the capacitors and ensures high capacitance.

Also, unlike a conventional two-terminal multilayer chip capacitor (refer to FIGS. 1(a) and 1(b)), terminals of the capacitor embedded in the printed circuit board are formed on a top and a bottom of the capacitor, not both sides thereof (That is, the embedded chip capacitor includes top and bottom terminals). Therefore, the internal electrodes having the same polarity of the multilayer chip capacitor are connected to each other through vias, which are led to a top or a bottom of the capacitor. Portions of the vias led to the top and bottom, or bumps formed thereon, or internal or external electrodes connected the portions of the vias led to the top and bottom constitute upper and lower terminals of the multilayer chip capacitor.

The upper and lower terminals of the multilayer chip capacitors arranged horizontally are directly connected to respective top and bottom conductive layers formed on the printed circuit board. This eliminates a need for via holes on multilayer plates (refer to numerals 30, 35 of FIG. 1(b)) and subsequent laser process therefore to connect substrate wiring to capacitor terminals, thus reducing manufacturing costs of the printed circuit board considerably.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
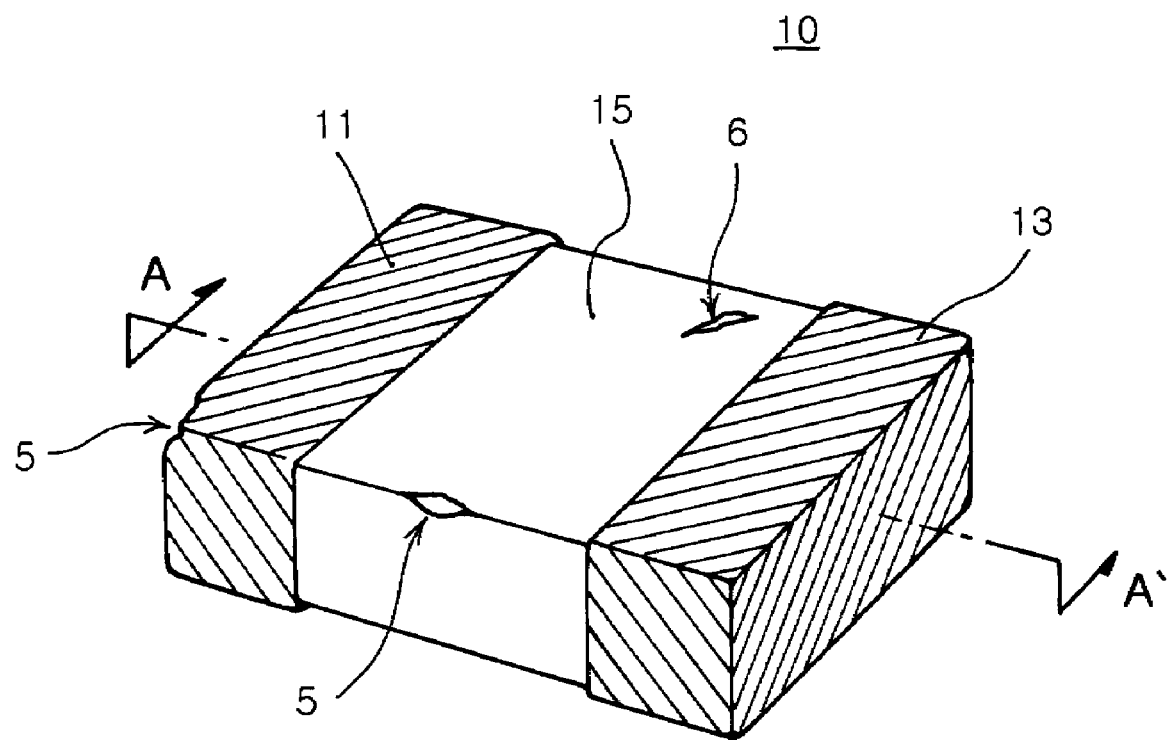
FIG. 1(a) is a perspective view illustrating a conventional embedded multilayer chip capacitor.
FIG. 1(b) is a sectional view illustrating the capacitor taken along the line AA' in FIG. 1(a).
Figure 1:
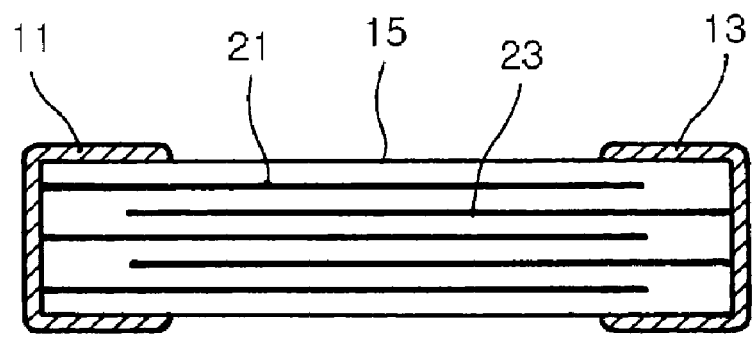
Figure 2:
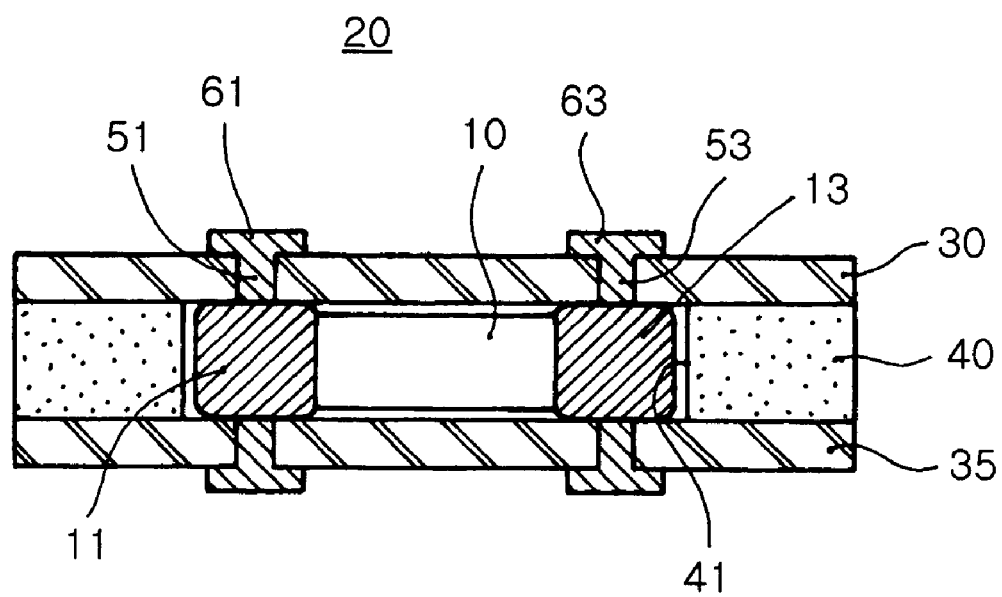
FIG. 2(a) is a schematic sectional view illustrating a conventional printed circuit board.
FIG. 2(b) is a schematic sectional view for explaining problems of the printed circuit board of FIG. 2(a).
Figure 2:
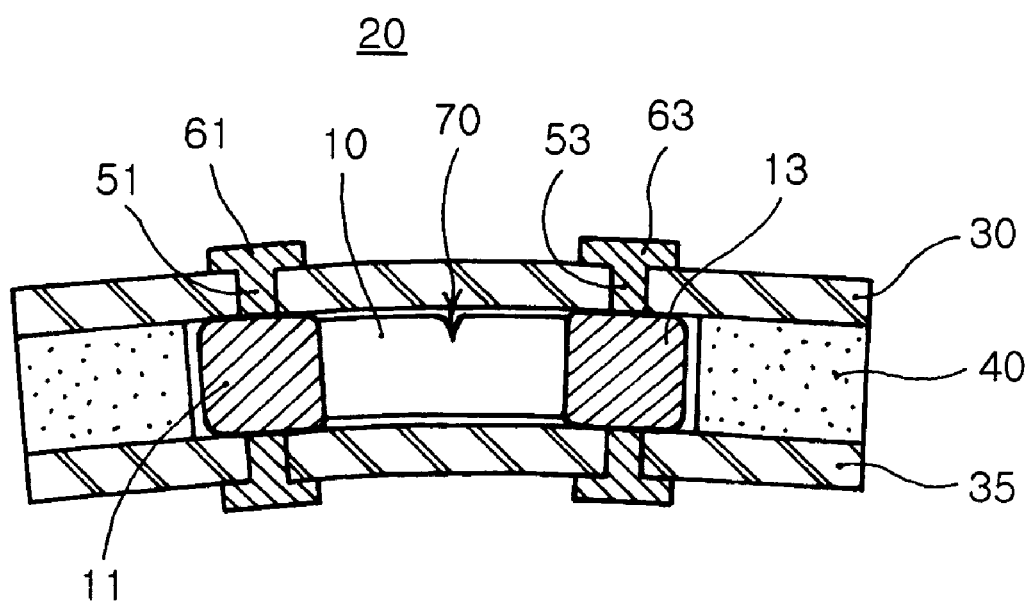

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Figure 3:
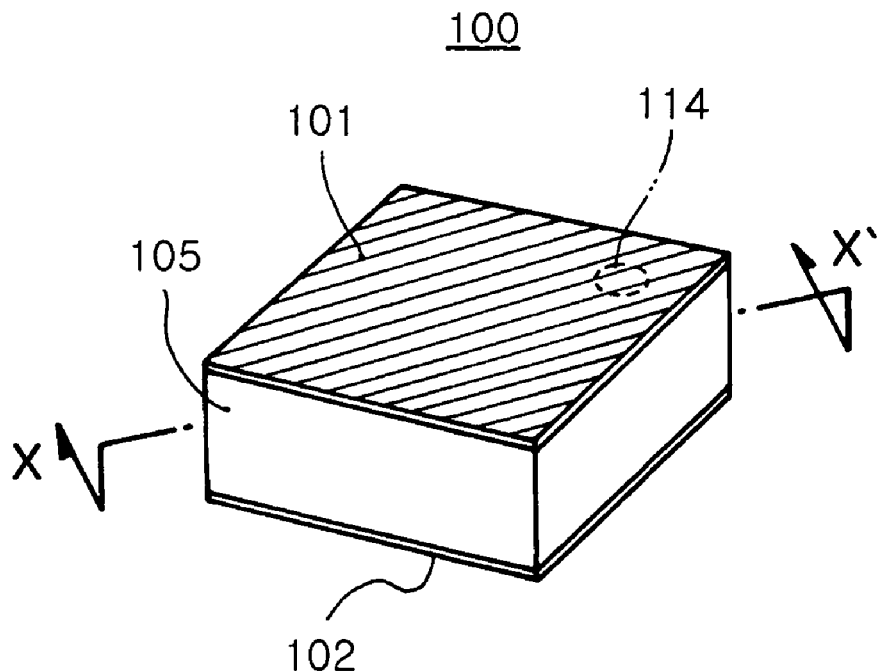
FIG. 3(a) is a fragmentary perspective view illustrating an embodiment of an embedded multilayer chip capacitor according to the invention.
FIG. 3(b) is a sectional view of the capacitor taken along the line XX' in FIG. 3(a)
Figure 3:
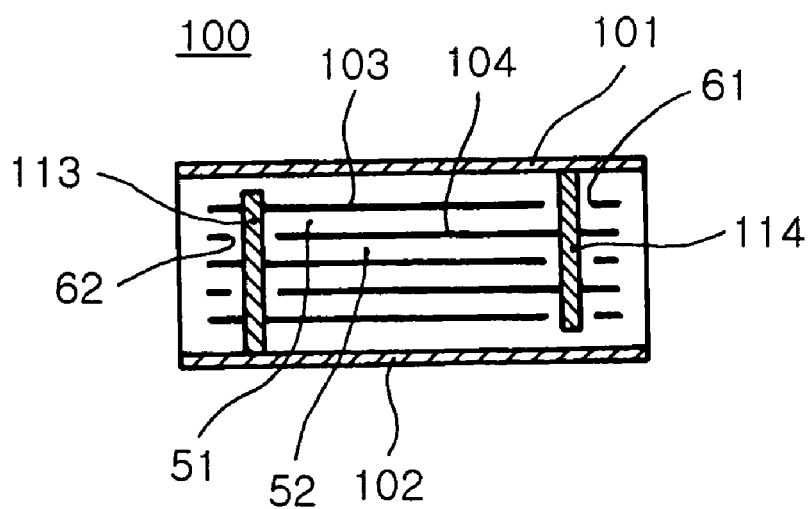

FIG. 3(a) is a fragmentary perspective view of an embodiment of an embedded multilayer chip capacitor according to the invention, and FIG. 3(b) is a sectional view of the capacitor taken along the line XX' in FIG. 3(a). Referring to FIGS. 3(a) and 3(b), an embedded multilayer chip capacitor 100 of the invention includes a capacitor body 105, an upper external electrode 101 formed on a top of the capacitor body 105, and a lower external electrode formed on a bottom of the capacitor body 105. The capacitor body 105 has a plurality of dielectric layers stacked one on another (refer to numerals 51, 52 of FIG. 4).

As shown in FIG. 3(b), a plurality of first internal electrodes 103 and second internal electrodes 104 are formed inside the capacitor body 105, separated by the dielectric layers 51, 52. The first internal electrodes 103 and the second internal electrodes 104 exhibit opposite polarity. Also, a first via 113 and a second via 114 are extended vertically inside the capacitor body 105. The first via 113 is connected to the first internal electrodes 103, and the second via 114 is connected to the second internal electrodes 104. The vias 113, 114 are conductive. The first via 113 is led to a bottom of the capacitor body 105 and the second via 114 is led to a top of the capacitor body 105. The portion of the first via led to the bottom 113 is connected to a lower external electrode 102 and the portion of the second via led to the top 114 is connected to an upper external electrode 101. Such vias allow a top-bottom structure external terminal.

Figure 4A:
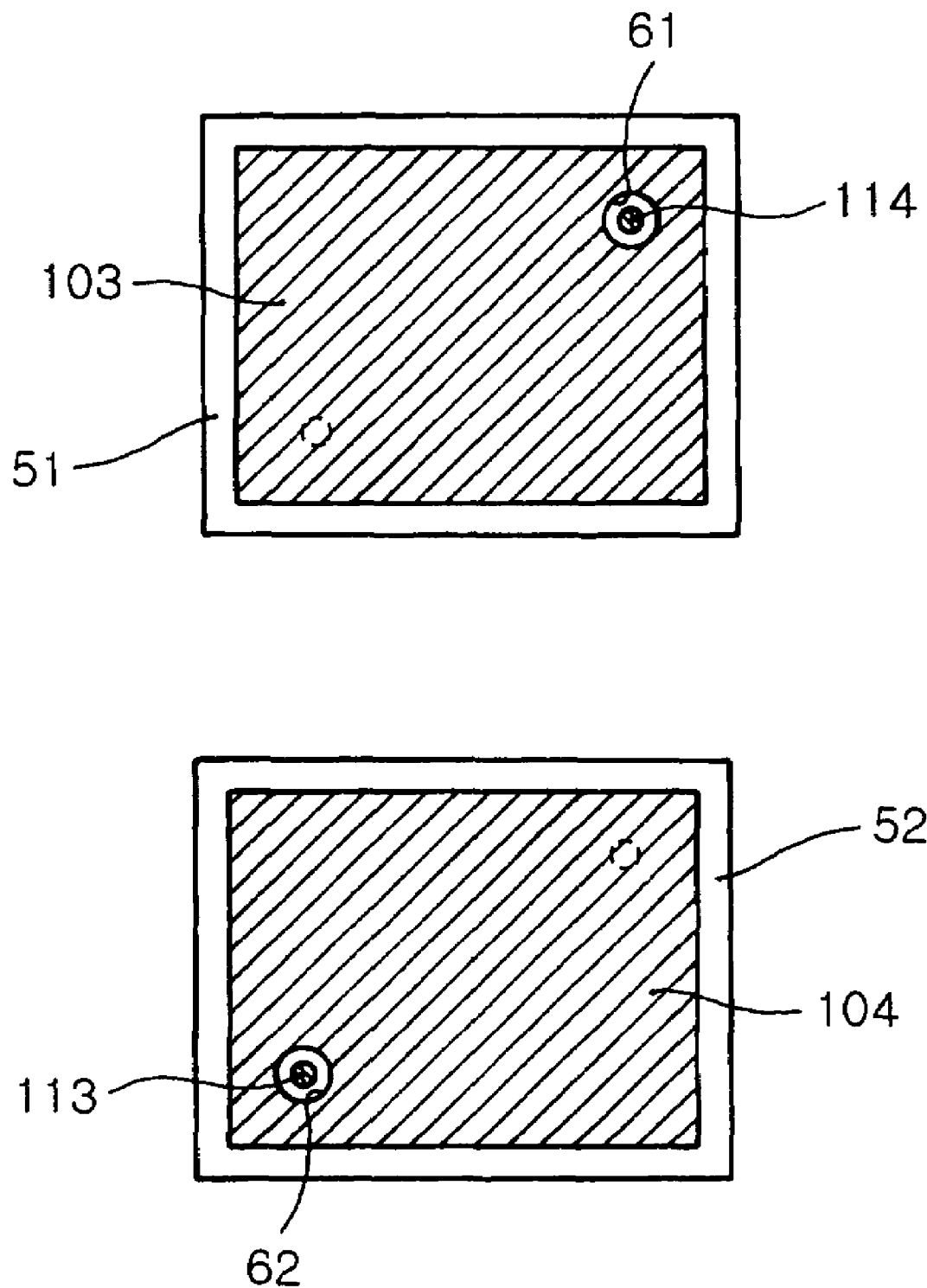
FIGS. 4a to 4c are plan views illustrating shape of internal electrodes of embedded multilayer chip capacitor according to several embodiments of the invention.

FIG. 4a is a plan view illustrating shape of the internal electrodes 103, 104 positioned inside the multilayer chip capacitor 100. Referring to FIG. 4a, the first internal electrodes 103 and the second internal electrodes 104 are formed on the dielectric layers 51, 52. The first and second internal electrodes 103, 104 have through holes 61, 62, respectively. The first via 113 passes the through holes 62 formed in the second internal electrodes 104 but does not touch the inner circumferences of the through holes 62. Also, the first via 113 meets and connects to the first internal electrodes 103. As shown in FIG. 4a, a dot-lined part shown in the electrode surface of the first internal electrode 103 indicates the portion where the first internal electrode 103 meets and connects to the first via 113. Accordingly, the first via 113 is only coupled to the first internal electrodes 103 but not to the second internal electrodes 104. Likewise, the second via 114 is only coupled to the second internal electrodes 104 but not to the first internal electrodes 103. Therefore, voltage having opposite polarity is supplied to the first internal electrodes 103 and the second internal electrodes 104. According to this embodiment, a thorough hole is formed in the internal electrodes, but the invention is not limited thereto. Internal electrodes having other structure may be employed. For example, the internal electrode structure shown in FIG. 4b or 4c may be employed.

Figure 4B:
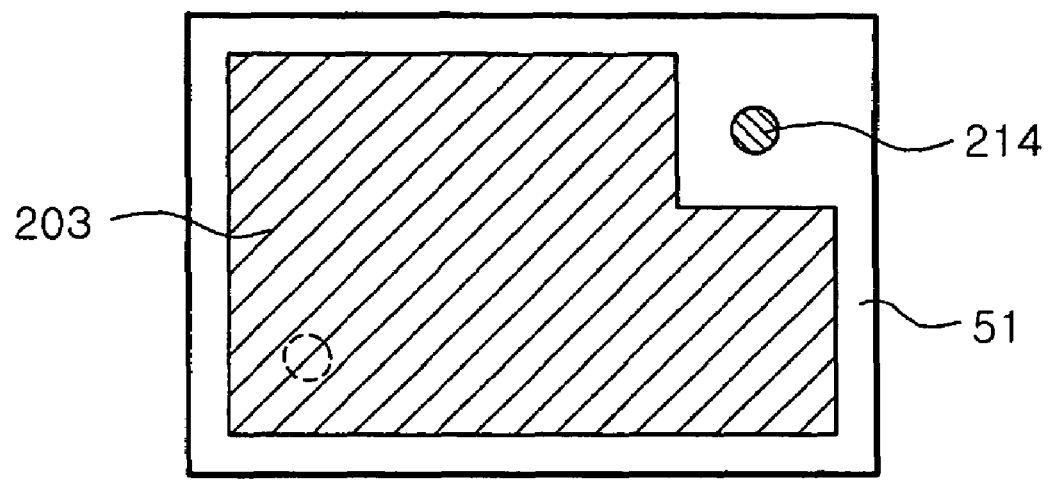
Figure 4B:
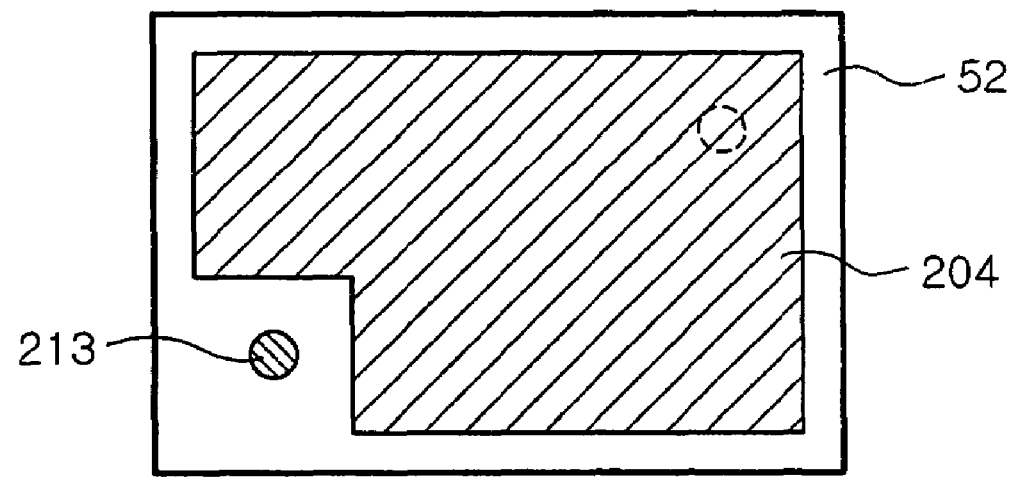

Referring to FIG. 4b, first internal electrodes 203 and second internal electrodes 204, each having a cut at a corner, are formed on the dielectric layers 51, 52. A corner of each of the first internal electrodes 203 is cut out so that a second via 214 is not connected to the first internal electrodes 203. As a result, the first internal electrodes 203 are only connected to the first via 213 but not to the second via 214. Likewise, a corner of each of the second internal electrodes 204 is cut out so that the second internal electrodes 204 are only connected to the second via 214 but not to the first via 213. Consequently, voltage having opposite polarity can be supplied to the first internal electrodes 203 and the second internal electrodes 204.

Figure 4C:
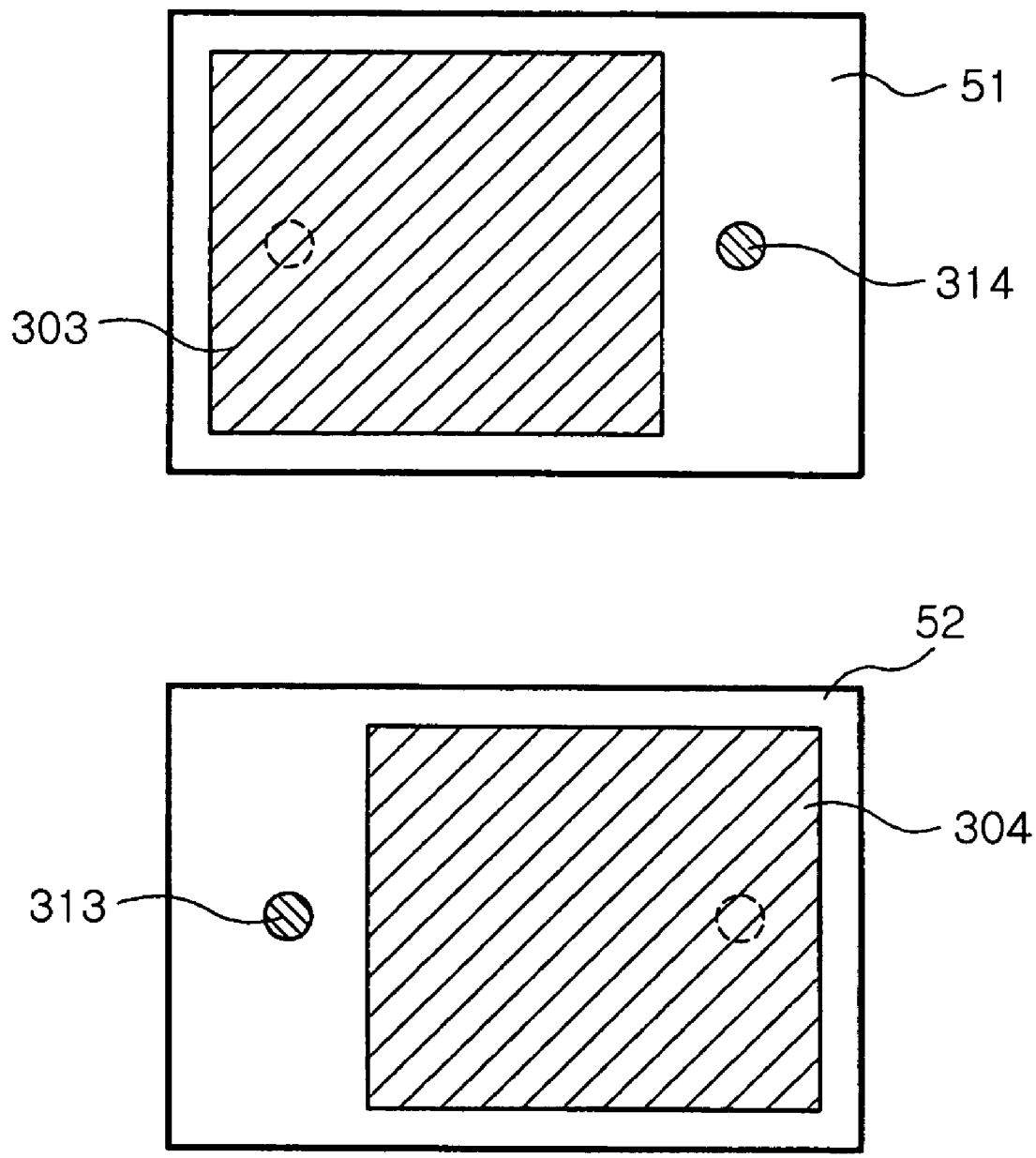

Referring to FIG. 4c, first internal electrodes 303 and second internal electrodes 304 are biased toward the left and right alternatively on the dielectric layers 51, 52. The first internal electrodes 303 are biased toward one side so that the second via 314 is not connected to the first internal electrodes 303. As a result, the first internal electrodes 303 are only coupled to the first via 313 but not to the second via 314. The second internal electrodes 304 are biased toward another side so as to be only connected to the second via 313 but not to the first via 313. Consequently, voltage having opposite polarity can be supplied to the first internal electrodes 303 and the second internal electrodes 304.

Unlike a conventional embedded multilayer chip capacitor (refer to FIG. 1(a)), the capacitor 100 has a small ratio of horizontal length with respect to thickness. Preferably, the multilayer chip capacitor 100 has a width of 0.4 to 2.0 mm, a length of 0.4 to 2.0 mm and a thickness of 0.05 to 1.0 mm. A ratio of horizontal length (width and length) is sufficiently decreased to prevent damage of the embedded capacitor 100 in the board even though a printed circuit board is bent. Further, small size (especially horizontal length) of the capacitor reduces possibility of chipping or cracking that may occur in the process of manufacturing or handling the multilayer chip capacitor. Decrease in capacitance caused by small size can be overcome by connecting several capacitors 100 in parallel, as stated later.

Referring to FIGS. 4a to 4c, the first and second vias 113, 114 have a circular cross section. Preferably, the section of the vias 113, 114 is 50 to 500 μm in diameter. Alternatively, the first and second vias may have a rectangular cross section. Preferably, the section of the first and second vias is 50 to 500 μm in width and length, respectively. Further, the first and second vias may have a triangle, hexagonal or other-shaped cross section. The invention is not limited by a shape of the via cross section.

Figure 5:
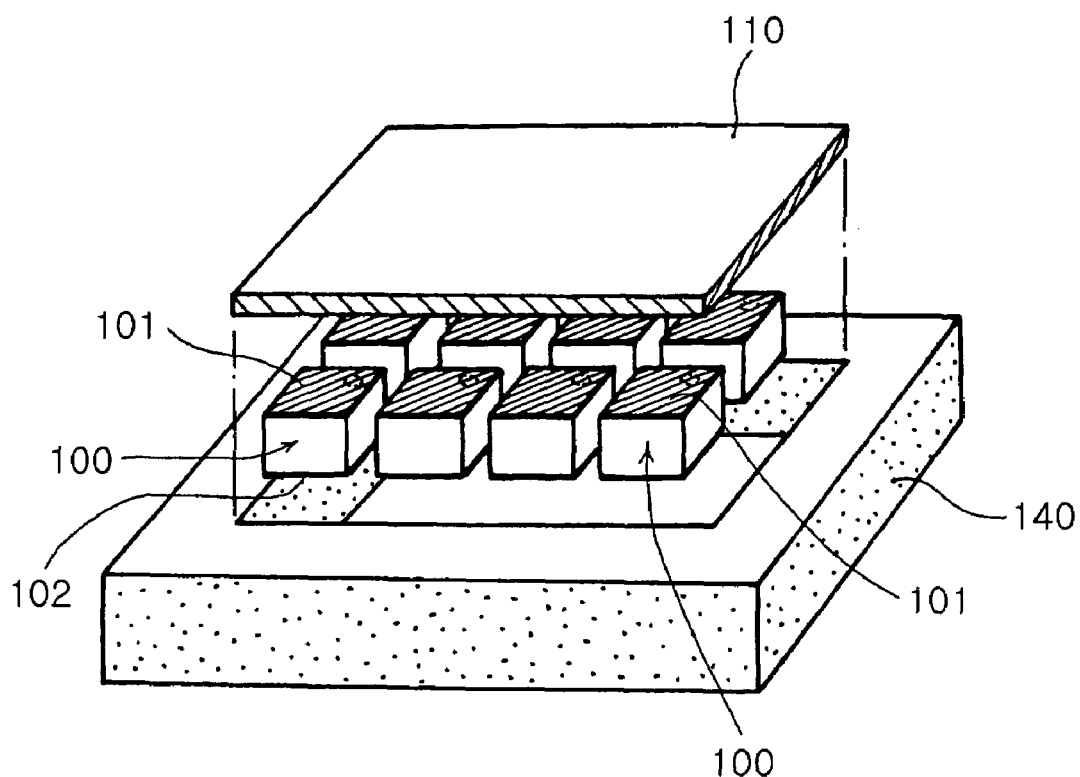
FIG. 5 is an exploded perspective view illustrating an embodiment of a printed circuit board according to the invention.
Figure 6:
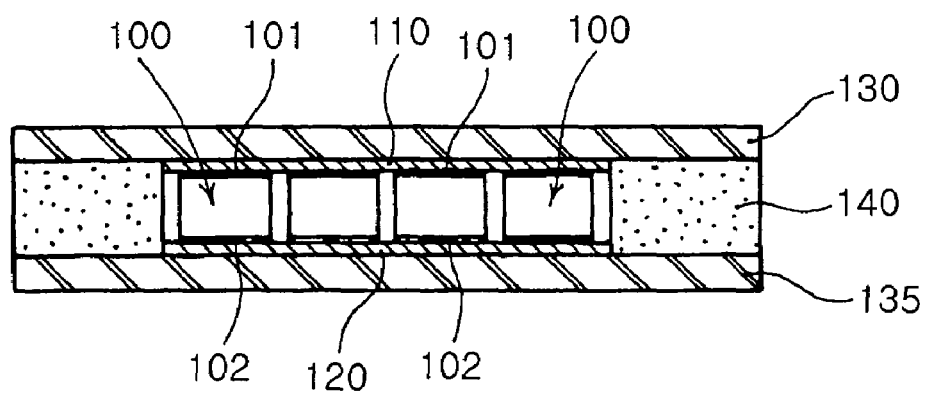
FIG. 6 is a schematic sectional view of the printed circuit board shown in FIG. 5.

An explanation will be given hereunder with respect to a printed circuit board including an embedded multilayer chip capacitor. FIG. 5 is an exploded perspective view illustrating an embodiment of a printed circuit board according to the invention. FIG. 6 is a schematic sectional view of the printed circuit board in FIG. 5. Referring to FIGS. 5 and 6, the printed circuit board 500 has a plurality of multilayer chip capacitors 100 embedded therein. A structure of the capacitor 100 embedded in the printed circuit board 500 has been explained earlier. (refer to FIG. 3 and FIGS. 4a to 4c).

As shown in FIGS. 5 and 6, the printed circuit board 500 includes a core substrate 140 having a groove for embedding a capacitor therein. An upper multilayer plate 130 and a lower multilayer plate 135 are stacked on a top and a bottom of the core substrate 140. In a groove formed on the core substrate 140, the multilayer chip capacitors are arranged horizontally. Also, an upper conductive layer 110 and a lower conductive layer 120 are formed on a top and a bottom of the multilayer chip capacitors arranged horizontally. A conductive adhesion polymer layer, a conductive tape, a conductive epoxy resin layer, a conductive paste layer or a plated layer may be used for the upper and lower conductive layers 110, 120. The conductive tape used for the upper and lower conductive layers 110, 120 include an anisotropic conductive tape or a carbon tape.

The upper conductive layer 110 and lower conductive layer 120 connect the horizontally arranged capacitors 100 in parallel. That is, upper external electrodes 101 of the capacitors 100 are connected to the upper conductive layer 110 while lower external electrodes 102 are connected to the lower conductive layer 120. The upper conductive layer 110 and lower conductive layer 120 are coupled to a wiring structure (not illustrated) formed on the printed circuit board, respectively to impress voltage to the capacitors 100.

By connecting the small-sized capacitors 100 having terminals of a top-bottom structure to the upper and lower conductive layers 110, sufficient capacitance is ensured and the capacitors are prevented from being damaged even if the printed circuit board 500 is warped.

According to the invention, terminals of the embedded multilayer chip capacitor are configurable in various methods. In other words, top-bottom capacitor terminals can be configured without employing upper and lower external electrodes as described above. The examples are shown in FIGS. 7 and 9.

Figure 7:
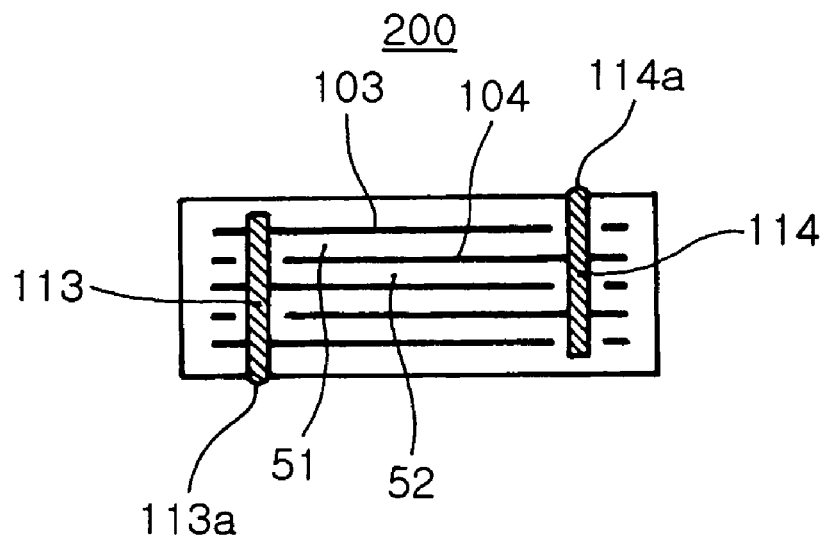
FIG. 7 is a sectional view illustrating another embodiment of an embedded multilayer chip capacitor according to the invention.
Figure 8:
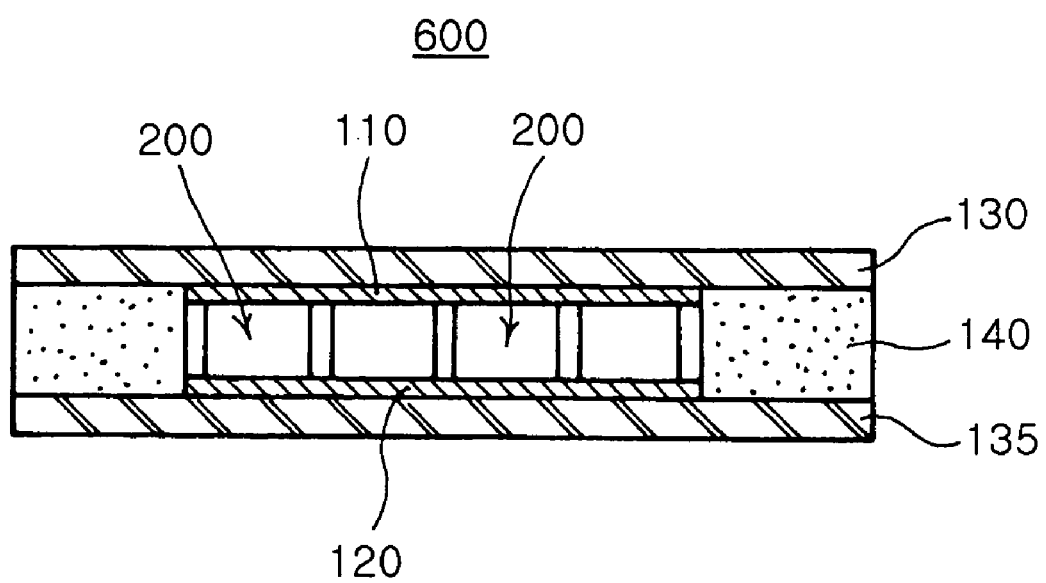
FIG. 8 is a schematic sectional view illustrating another embodiment of a printed circuit board according to the invention.

FIG. 7 is a sectional view illustrating another embodiment of an embedded multilayer chip capacitor according to invention. Referring to FIG. 7, a multilayer chip capacitor 200 does not have external electrodes on a top and a bottom thereof. Instead, portions 113a, 114a of vias 113, 114 led to a top and a bottom serve as external terminals of the capacitor 200. Other components of the capacitor 200 are as mentioned above. FIG. 8 shows a printed circuit board 600 manufactured by employing the embedded chip capacitor 200.

Referring to FIG. 8, the plurality of multilayer chip capacitors 200 arranged horizontally are connected to each other through the upper and lower conductive layers 110, 120 without separate external electrodes. That is, the portion 113a of the first via 113 led to the bottom is directly connected to the lower conductive layer 120, while the portion 114a of the second via 114 led to the top is directly connected to the upper conductive layer 110. Accordingly, the plurality of multilayer chip capacitors 200 are connected in parallel to ensure high capacitance.

Figure 9:
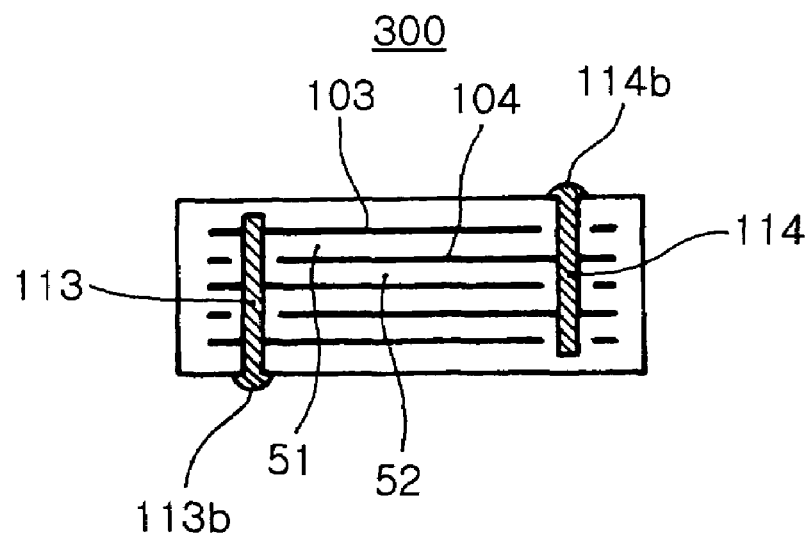
FIG. 9 is a sectional view illustrating another embodiment of an embedded multilayer chip capacitor according to the invention.
Figure 10:
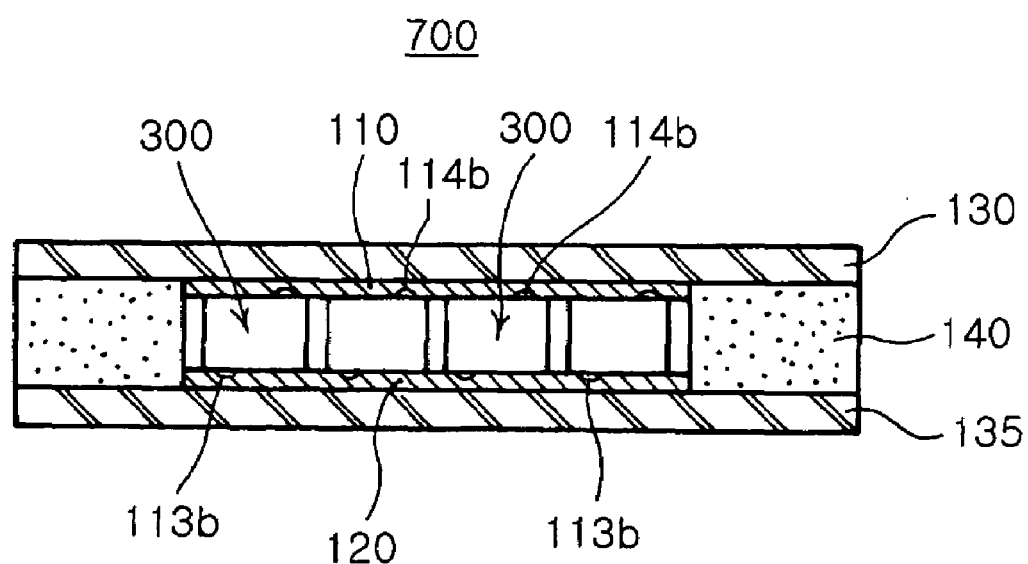
FIG. 10 is a schematic sectional view of yet another embodiment of a printed circuit board according to the invention.

Alternatively, as shown in FIG. 9, an embedded multilayer chip capacitor 300 may have bumps 113b, 114b in the portions of the vias 112, 113 led to the top and bottom. When the capacitor is embedded in the printed circuit substrate, the bumps are directly connected to the upper and lower conductive layers. FIG. 10 illustrates a printed circuit board 700 manufactured by employing the embedded chip capacitor 300 having the bumps 113b, 114b.

Referring to FIG. 10, the plurality of multilayer chip capacitors 300 arranged horizontally are connected to each other through the upper and lower conductive layers 110, 120 without separate external electrodes. That is, the bump 113b of the first via 113 is directly connected to the lower conductive layer 120 whereas the bump 114b of the second via 114 is directly connected to the upper conductive layer. As a result, the multilayer chip capacitors 300 are connected to each other in parallel to achieve high capacitance.

As set forth above, according to the invention, the embedded multilayer chip capacitor can have top-to-bottom terminals by forming vias therein side so as to suffer less mechanical damage such as chipping or cracking. Further, the plurality of chip capacitors having a reduced horizontal length can be arranged horizontally to be connected in parallel so that in case of warping of the printed circuit board, the capacitor embedded in the board does not sustain mechanical damage. In addition, high capacitance can be attained by connecting a number of embedded chip capacitors. This obviates a need for a separate process of forming via holes to couple terminals of the embedded multilayer chip capacitor to board wiring. Therefore, there is no problem of misalignment that occurs during a laser processing, and manufacturing cost of the printed circuit board can be saved.

While the present invention has been shown and described in connection with the preferred embodiments, it will be apparent to those skilled in the art that modifications and variations can be made without departing from the spirit and scope of the invention as defined by the appended claims.

What is claimed is:

1. An embedded multilayer chip capacitor comprising:
   a capacitor body having a plurality of dielectric layers stacked one on another;
   a plurality of first and second internal electrodes formed inside the capacitor body, separated by the dielectric layers; and
   first and second vias extended vertically inside the capacitor body, the first via connected to the first internal electrodes and the second via connected to the second internal electrodes,
   wherein the first via is led to a bottom of the capacitor body and the second via is led to a top of the capacitor body,
   wherein the first and second vias have a rectangular cross section and the section of the first and second vias is 50 to 500 μm in width and length, respectively.

2. The embedded multilayer chip capacitor according to claim 1, wherein the portion of the first via led to the bottom is connected to a lower conductive layer of a printed circuit board where the multilayer chip capacitor is embedded, and the portion of the second via led to the top is connected to an upper conductive layer of the printed circuit board.

3. The embedded multilayer chip capacitor according to claim 2, wherein the portion of the first via led to the bottom is directly connected to the lower conductive layer and the portion of the second via led to the top is directly connected to the upper conductive layer.

4. The embedded multilayer chip capacitor according to claim 1, wherein the first and second electrodes each have a through hole, and
   wherein the first via passes the through holes of the second internal electrodes without touching inner circumferences of the through holes of the second internal electrodes, and the second via passes the through holes of the first electrodes without touching inner circumferences of the through holes of the first internal electrodes.

5. The embedded multilayer chip capacitor according to claim 1, wherein the first internal electrodes have a cut at a corner so that the second via is not connected to the first internal electrodes, and the second internal electrodes have a cut at a corner so that the first via is not connected to the second internal electrodes.

6. The embedded multilayer chip capacitor according to claim 1, wherein the first internal electrodes are biased toward one side so that the second via is not connected to the first internal electrodes, and the second internal electrodes are biased toward another side so that the first via is not connected to the second internal electrodes.

7. The embedded multilayer chip capacitor according to claim 1, further comprising:
an upper external electrode formed on a top of the capacitor body; and
a lower external electrode formed on a bottom of the capacitor body,
wherein the lower external electrode is connected to the first internal electrodes through the first via, and the upper external electrode is connected to the second internal electrodes through the second via.

8. The embedded multilayer chip capacitor according to claim 1, further comprising a first bump formed on the portion of the first via led to the bottom, and a second bump formed on the portion of the second via led to the top.

9. The embedded multilayer chip capacitor according to claim 1, wherein the capacitor has a width of 0.4 to 2.0 mm, a length of 0.4 to 2.0 mm, and a thickness of 0.05 to 1.0 mm.

10. A printed circuit board comprising:
a core substrate having at least one cavity;
a plurality of multilayer chip capacitors arranged horizontally inside each of the at least one cavity of the core substrate; and
upper and lower conductive layers connecting the multilayer chip capacitors in parallel, the upper conductive layer formed on a top of the multilayer chip capacitors, and the lower conductive layer formed on a bottom of the multilayer chip capacitors;
wherein each of the multilayer chip capacitors comprises:
a capacitor body having a plurality of dielectric layers stacked one on another;
a plurality of first and second internal electrodes formed inside the capacitor body, separated by the dielectric layers; and
first and second vias extended vertically inside the capacitor body, the first via connected to the first internal electrodes and the second via connected to the second internal electrodes,
wherein the first via is led to a bottom of the capacitor body and the second via is led to a top of the capacitor body.

11. The printed circuit board according to claim 10, wherein the upper and lower conductive layers comprise one selected from a group consisting of a conductive adhesion polymer layer, a conductive tape, a conductive epoxy resin layer, a conductive paste layer and plated layer.

12. The printed circuit board according to claim 10, wherein each of the multilayer chip capacitors further comprises:
an upper external electrode formed on a top of the capacitor body; and
a lower external electrode formed on a bottom of the capacitor body,
wherein the upper external electrode is directly connected to the upper conductive layer and the lower external electrode is directly connected to the lower conductive layer.

13. The printed circuit board according to claim 10, wherein each of the multilayer chip capacitors further comprises:
a first bump formed on the portion of the first via led to the bottom, and a second bump formed on the portion of the second via led to the top,
wherein the first bump is directly connected to the lower conductive layer and the second bump is directly connected to the upper conductive layer.

14. The printed circuit board according to claim 10, wherein the portion of the first via led to the bottom is directly connected to the lower conductive layer, and the portion of the second via led to the top is directly connected to the upper conductive layer.

15. The printed circuit board according to claim 10, wherein the capacitor has a width of 0.4 to 2.0 mm, a length of 0.4 to 2.0 mm, and a thickness of 0.05 to 1.0 mm.

16. The printed circuit board according to claim 10, wherein the first and second vias have a rectangular cross section and the section of the first and second vias is 50 to 500 μm in width and length, respectively.

17. A printed circuit board comprising:
a core substrate having at least one cavity;
a plurality of multilayer chip capacitors arranged horizontally inside each of the at least one cavity of the core substrate; and
upper and lower conductive layers connecting the multilayer chip capacitors in parallel, the upper conductive layer formed on a top of the multilayer chip capacitors, and the lower conductive layer formed on a bottom of the multilayer chip capacitors.

* * * * *